United States Patent
Wang et al.

(10) Patent No.: US 11,367,842 B2
(45) Date of Patent: Jun. 21, 2022

(54) FLEXIBLE SUBSTRATE, MANUFACTURING METHOD FOR FLEXIBLE SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Wang, Beijing (CN); Zhifeng Zhan, Beijing (CN); Jiafan Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 603 days.

(21) Appl. No.: 16/337,731

(22) PCT Filed: Oct. 29, 2018

(86) PCT No.: PCT/CN2018/112388
§ 371 (c)(1),
(2) Date: Mar. 28, 2019

(87) PCT Pub. No.: WO2019/165792
PCT Pub. Date: Sep. 6, 2019

(65) Prior Publication Data
US 2021/0376263 A1    Dec. 2, 2021

(30) Foreign Application Priority Data
Feb. 27, 2018    (CN) .......................... 201810162327.7

(51) Int. Cl.
H01L 29/08    (2006.01)
H01L 51/00    (2006.01)
H01L 51/52    (2006.01)

(52) U.S. Cl.
CPC ...... *H01L 51/0097* (2013.01); *H01L 51/0017* (2013.01); *H01L 51/5246* (2013.01); *H01L 2251/558* (2013.01)

(58) Field of Classification Search
None
See application file for complete search history.

(56) References Cited

U.S. PATENT DOCUMENTS 9,865,670 B2    1/2018   Park et al.
10,069,107 B2 *  9/2018   Jeon .................... H01L 51/0097

FOREIGN PATENT DOCUMENTS

CN    106449695 A    2/2017
CN    106847870 A    6/2017
(Continued)

OTHER PUBLICATIONS

International Search Report dated Jan. 29, 2019 issued in corresponding International Application No. PCT/CN2018/112388.
(Continued)

*Primary Examiner* — Hung K Vu
(74) *Attorney, Agent, or Firm* — Nath, Goldberg & Meyer; Joshua B. Goldberg

(57) ABSTRACT

The present disclosure provides a flexible substrate, the flexible substrate is divided into a display region, a binding region on a side of the display region, a to-be-bent region between the display region and the binding region, two transition regions between the to-be-bent region and the display region and between the to-be-bent region and the binding region respectively; the transition regions comprise a plurality of transition sub-regions arranged in a first (Continued)

direction, the first direction is a direction from the display region to the binding region; the flexible substrate comprises a flexible base and a back film disposed on the flexible base, a portion of the back film is located in the transition regions; in any one of the transition regions, the amount of distribution per unit area of the back film in each of the transition sub-regions gradually decreases in a direction gradually approaching the to-be-bent region.

14 Claims, 5 Drawing Sheets

(56) References Cited

FOREIGN PATENT DOCUMENTS

| CN | 107845643 A | 3/2018 |
|----|-------------|--------|
| CN | 108305880 A | 7/2018 |
| JP | 2016-31499 A | 3/2016 |

OTHER PUBLICATIONS

Office Action dated Mar. 3, 2020 issued in corresponding Chinese Application No. 201810162327.7.

\* cited by examiner

FLEXIBLE SUBSTRATE, MANUFACTURING METHOD FOR FLEXIBLE SUBSTRATE AND DISPLAY DEVICE

CROSS-REFERENCE TO RELATED APPLICATION

This is a National Phase Application filed under 35 U.S.C. 371 as a national stage of PCT/CN2018/112388, filed on Oct. 29, 2018, an application claiming the priority of China Application No. 201810162327.7, filed on Feb. 27, 2018 to China National Intellectual Property Administration (CNIPA), entitled "FLEXIBLE SUBSTRATE, MANUFACTURING METHOD FOR FLEXIBLE SUBSTRATE AND DISPLAY DEVICE", the entire contents of each of which are hereby incorporated by reference.

TECHNICAL FIELD

The present disclosure relates to the field of display technologies, and in particular to a flexible substrate, a manufacturing method thereof and a display device.

BACKGROUND

In the display device, one side of a display area of a display substrate is provided with a binding electrode for transmitting an electrical signal of a driving circuit to the display area. In the conventional technology, after the flexible circuit board is electrically connected to the binding electrode, the flexible circuit board is bent to the side of the display substrate facing away from the display. In order to reduce the width of the border of the display device, the manufacturer began to gradually adopt a flexible display panel, and directly bend the flexible substrate therein to bend the binding region to the back of the flexible substrate, so as to reduce the bending radius. However, at present, after the flexible substrate is bent, the initial position of the bending region is prone to breakage of the signal line.

SUMMARY

The present disclosure provides a flexible substrate, wherein the flexible substrate is divided into a display region, a binding region on a side of the display region, a to-be-bent region between the display region and the binding region, two transition regions between the to-be-bent region and the display region and between the to-be-bent region and the binding region respectively; the transition regions comprise a plurality of transition sub-regions arranged in a first direction, the first direction is a direction from the display region to the binding region; the flexible substrate comprises a flexible base and a back film disposed on the flexible base, a portion of the back film is located in the transition regions; in any one of the transition regions, the amount of distribution per unit area of the back film in each of the transition sub-regions gradually decreases in a direction gradually approaching the to-be-bent region.

Alternatively, a thickness of the back film in any one of the transition regions gradually decreases in the direction gradually approaching the to-be-bent region.

Alternatively, a thickness of the back film in any one of the transition sub-regions remains constant or gradually decreases in the direction gradually approaching the to-be-bent region.

Alternatively, in any one of the transition regions, a coverage rate of the back film in each of the transition sub-regions gradually decreases in the direction gradually approaching the to-be-bent region.

Alternatively, the portion of the back film located in the transition regions comprises a plurality of transition pattern portions, the plurality of transition pattern portions are arranged in a second direction perpendicular to the first direction; a size of the transition pattern portions in the second direction gradually decreases from a side of the transition pattern portions away from the to-be-bent region to a side of the transition pattern portions close to the to-be-bent region.

Alternatively, a portion of the back film located outside the transition regions is disposed in the display region and the binding region, a thickness of the back film in both the display region and the binding region is greater than or equal to the thickness of the back film in the transition regions.

Alternatively, an adhesive layer is further disposed between the back film and the flexible base, the adhesive layer covers the entire flexible base.

Correspondingly, the present disclosure further provides a manufacturing method for flexible substrate, the flexible substrate being divided into a display region, a binding region on a side of the display region, a to-be-bent region between the display region and the binding region, two transition regions between the to-be-bent region and the display region and between the to-be-bent region and the binding region respectively; the transition regions comprising a plurality of transition sub-regions arranged in a first direction, the first direction being a direction from the display region to the binding region; the manufacturing method comprising: providing a flexible base; forming a back film on the flexible base; wherein a portion of the back film is located in the transition regions; in any one of the transition regions, the amount of distribution per unit area of the back film in each of the transition sub-regions gradually decreases in a direction gradually approaching the to-be-bent region.

Alternatively, the step of forming a back film on the flexible base comprises: forming an initial back film; performing laser etching on the initial back film to form the back film.

Alternatively, the step of performing laser etching on the initial back film comprises: performing a first etching process on a portion of the initial back film located in the transition regions such that a thickness of the back film in any one of the transition regions gradually decreases in the direction gradually approaching the to-be-bent region.

Alternatively, the thickness of the back film in any one of the transition sub-regions remains constant or gradually decreases in the direction gradually approaching the to-be-bent region.

Alternatively, the first etching process comprises etching the initial back film at least once in each of the transition sub-regions, and the number of etchings performed in each of the transition sub-regions gradually increases in the direction gradually approaching the to-be-bent region.

Alternatively, the step of performing laser etching on the initial back film comprises: performing a second etching process on a portion of the initial back film located in the transition regions, such that in any one of the transition regions, a coverage rate of the back film in each of the transition sub-regions gradually decreases in the direction gradually approaching the to-be-bent region.

Alternatively, the portion of the back film located in the transition regions comprises a plurality of transition pattern portions, the plurality of transition pattern portions are arranged in a second direction perpendicular to the first direction; and a size of the transition pattern portions in the second direction gradually decreases from a side of the transition pattern portions away from the to-be-bent region to a side of the transition pattern portions close to the to-be-bent region.

Alternatively, a portion of the back film located outside the transition regions is disposed in the display region and the binding region, a thickness of the back film in both the display region and the binding region is greater than or equal to the thickness of the back film in the transition regions.

Alternatively, the step of forming the back film on the flexible base further comprises: forming an adhesive layer on the flexible base, the back film is located on a side of the adhesive layer away from the flexible base.

Correspondingly, the present disclosure further provides a display device comprising a display substrate obtained by bending a flexible substrate described above along a to-be-bent region of the flexible substrate.

BRIEF DESCRIPTION OF THE DRAWINGS

The accompanying drawings are intended to provide a further understanding to disclosure and form part of the specification for explaining the disclosure in conjunction with the following specific embodiments, but are not intended to limit to the disclosure. In the drawings.

DETAILED DESCRIPTION OF THE EMBODIMENTS

The specific embodiments of the present disclosure will be described in detail below with reference to the accompanying drawings. It is to be understood that the specific embodiments described herein are for illustrative purposes only and are not intended to limit the disclosure.

Figure 1:
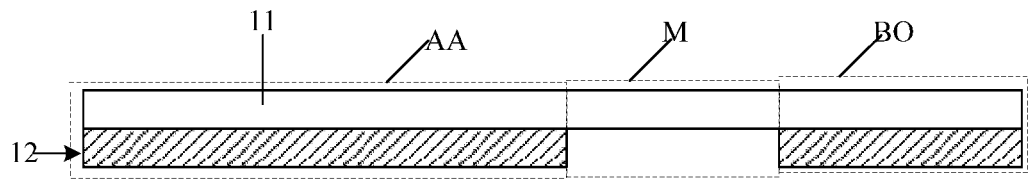
FIG. 1 is a schematic view of a flexible substrate in the related art.
Figure 2:
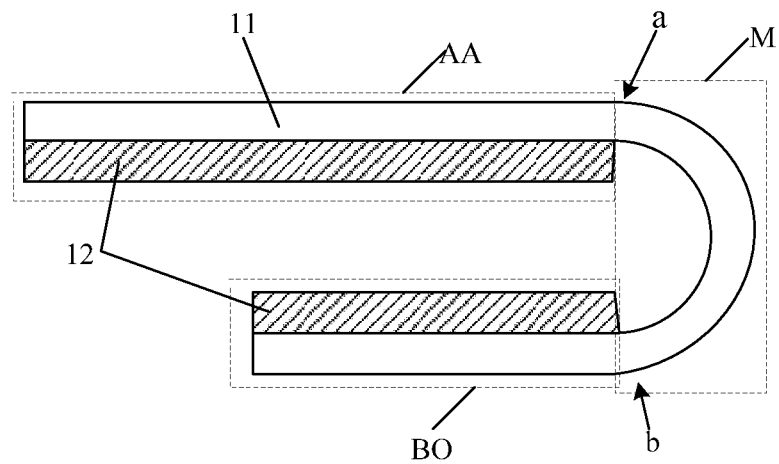
FIG. 2 is a schematic view of the flexible substrate of FIG. 1 after being bent.

FIG. 1 is a schematic view of a flexible substrate in the related art. The flexible substrate includes a flexible base 11 having opposing first and second surfaces. The first surface of the flexible base 11 is provided with a display device (not shown), and the second surface of the flexible base 11 is provided with a back film 12. The flexible substrate is divided into a display region AA, a binding region BO, and a space region M between the display region AA and the binding region BO. The display region AA is provided with a signal end, the binding region BO is provided with a binding electrode, and the signal end and the binding electrode are connected by a signal line. In order to reduce the border of the display product, the binding region BO needs to be bent to the back of the display region AA. Since the hardness of the back film 12 is relatively large, in order to achieve the desired bending radius, the back film in the space region M needs to be removed, and then the space region is bent, thereby obtaining the structure in FIG. 2. In FIG. 2, at the starting positions of the bending (Position a and Position b), the flexible base 11 is abruptly changed from a flat state to a curved state, and a thickness of the back film 12 is also abruptly changed. Therefore, stress concentration would be occurred at the starting positions of the bending. The thickness of the flexible base 11 is usually very thin, which tends to cause breakage of the signal line on the flexible base 11. In particular, when the bending shape is adjusted, the display region AA and the binding region BO are relatively moved in a left-right direction of FIG. 2. This makes it easier to cause the flexible base 11 to be subjected to a large force at the Position a and the Position b, resulting in breakage of the signal line.

In order to reduce breakage of the signal line when the flexible substrate is bent, an embodiment of the present disclosure provides a flexible substrate. Referring to FIGS. 3 to 6, the flexible substrate includes a flexible base 11 and a back film 12 disposed on the flexible base 11. The flexible substrate is divided into a display region AA, a binding region BO on a side of the display region AA, a to-be-bent region BE between the display region AA and the binding region BO, two transition regions TA between the to-be-bent region BE and the display region AA and between the to-be-bent region BE and the binding region BO respectively. The transition regions TA include a plurality of transition sub-regions TA' arranged in a first direction, the first direction is a direction from the display region AA to the binding region BO (i.e., the direction from left to right in FIG. 3). A portion of a back film 12 is located in the transition regions TA. In any one of the transition regions TA, the amount of distribution per unit area of the back film 12 in each of the transition sub-regions TA' gradually decreases in a direction gradually approaching the to-be-bent region BE.

It should be noted that the amount of distribution per unit area refers to the volume per unit area. The amount of distribution per unit area of the back film 12 in each of the transition sub-regions TA' means the ratio of the volume of the back film 12 in the transition sub-region TA' to the area of the transition sub-region TA'. Therefore, "the amount of distribution per unit area of the back film 12 in each of the transition sub-regions TA' gradually decreases in a direction gradually approaching the to-be-bent region BE" means that the closer a transition sub-region TA' is to the to-be-bent region BE, the smaller the amount of distribution per unit area of the back film 12 in the transition sub-region (the smaller the average volume per unit area) compared to other transition sub-regions farther away from the to-be-bent region BE.

Figure 7:
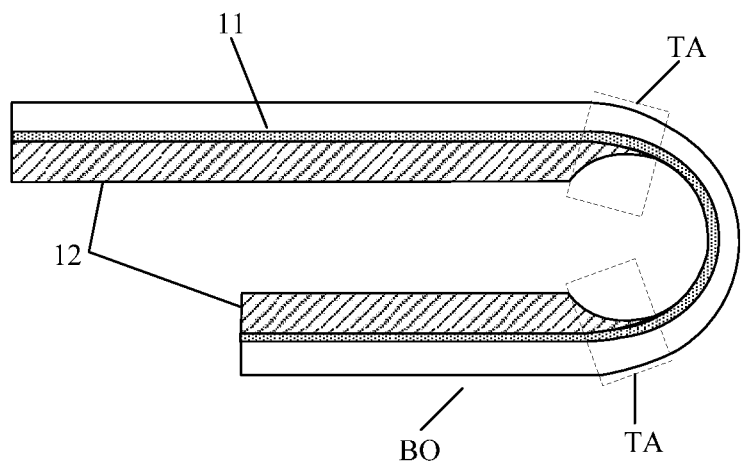
FIG. 7 is a schematic view showing a state of a flexible substrate after being bent in the present disclosure.
Figure 8:
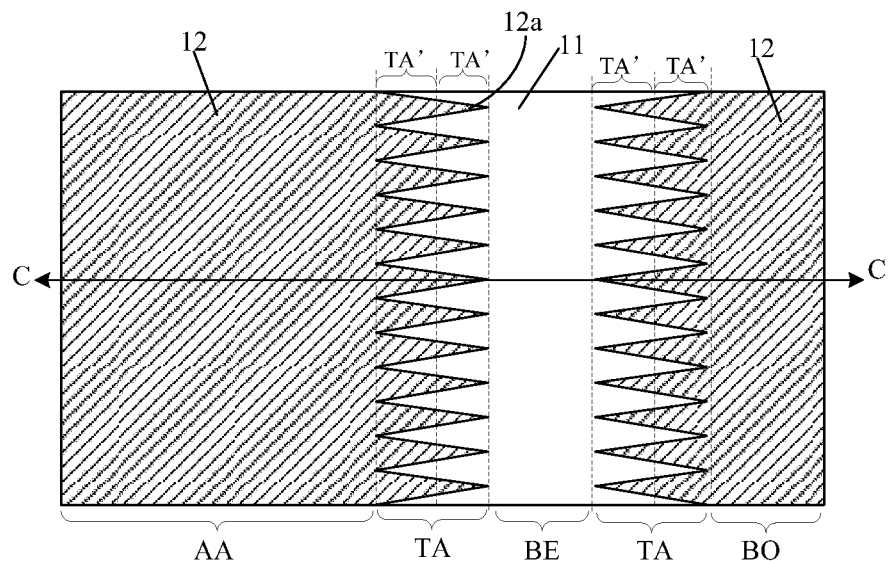
FIG. 8 is a plan view of a flexible substrate in an embodiment of the present disclosure.

Compared with the related art, in the flexible substrate in the present disclosure, since the amount of the back film 12 in the transition regions TA is not directly changed from a large amount to zero, but has a gradually decreasing transition process. When the to-be-bent region BE is bent, the problem of stress concentration does not occur, and the phenomenon that breakage of the signal line on the flexible base 11 due to a large stress is decreased. For example, as shown in FIG. 7, the portion of the flexible base 11 located in the transition regions TA smoothly transits into an arc shape, so that the back film 12 is no longer changed significantly at the starting position of the bending. Therefore, the problem of stress concentration does not occur. Similarly, as shown in FIG. 8, for example, the back film 12 is formed into a specific pattern in the transition regions TA, such that the amount of distribution per unit area of the back film in the transition sub-region TA' near the to-be-bent region BE decreases, compared with the amount of distribution per unit area of the back film in the other transition sub-regions TA' away from the to-be-bent region BE. Therefore, the stress of the back film 12 at the starting position of the bending does not change significantly, and the problem of stress concentration does not occur.

The area of the transition regions TA may be 0.5 to 2 times the area of the to-be-bent region BE.

In a specific embodiment of the present disclosure, the change in the amount of distribution per unit area of the back film in each transition sub-region TA' can be achieved by the change in the thickness of the back film 12. Specifically, the thickness of the back film 12 in any one of the transition regions TA gradually decreases in a direction gradually approaching the to-be-bent region BE. Herein, "gradually decrease" can be continuously decrease or intermittently decrease. For example, the thickness of the back film 12 may remain constant in a portion of the transition regions TA.

Figure 4:
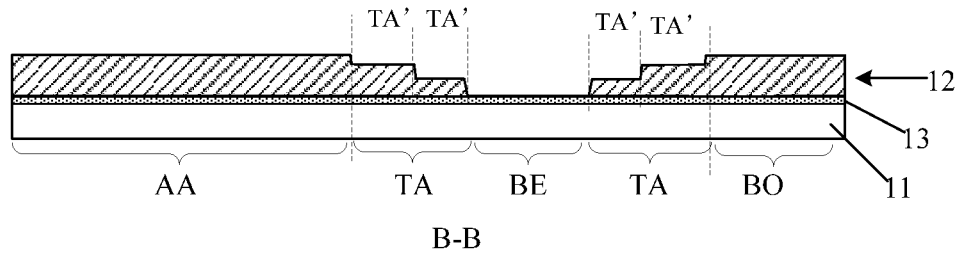
FIG. 4 is a first cross-sectional view taken along line BB of FIG. 3.
Figure 5:
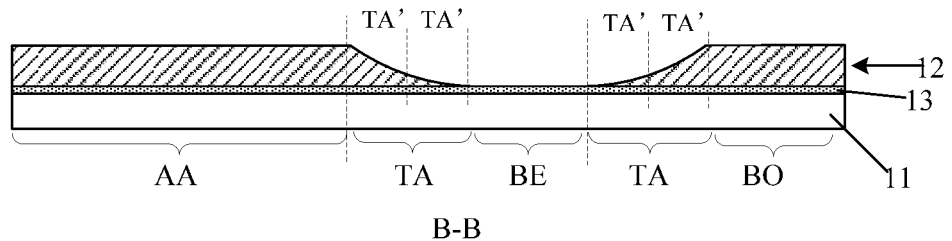
FIG. 5 is a second cross-sectional view taken along line BB of FIG. 3.
Figure 6:
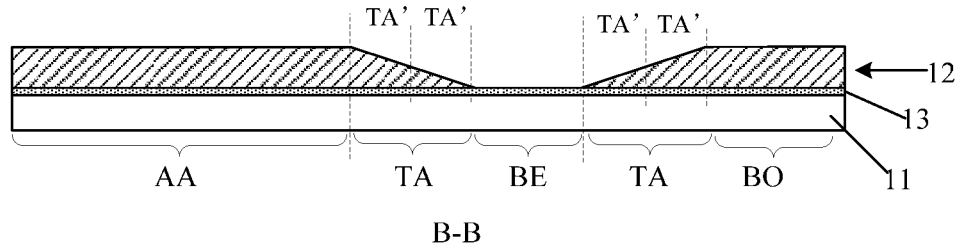
FIG. 6 is a third cross-sectional view taken along line BB of FIG. 3.

Further, in the same transition sub-region TA' of one transition region TA, the thickness of the back film 12 may be uniformly distributed or may be gradually changed. Specifically, as shown in FIG. 4, the thickness of the back film 12 in any one of the transition sub-regions TA' remains constant in the direction gradually approaching the to-be-bent region BE, so that the thickness of the back film 12 varies stepwise throughout the transition regions TA. Alternatively, as shown in FIGS. 5 and 6, the thickness of the back film 12 in any one of the transition sub-regions TA' gradually decreases in the direction gradually approaching the to-be-bent region BE, so that the back film 12 has an inclined plane (as shown in FIG. 6), a convex curved surface or a concave curved surface (as shown in FIG. 5) throughout the transition regions TA.

Figure 3:
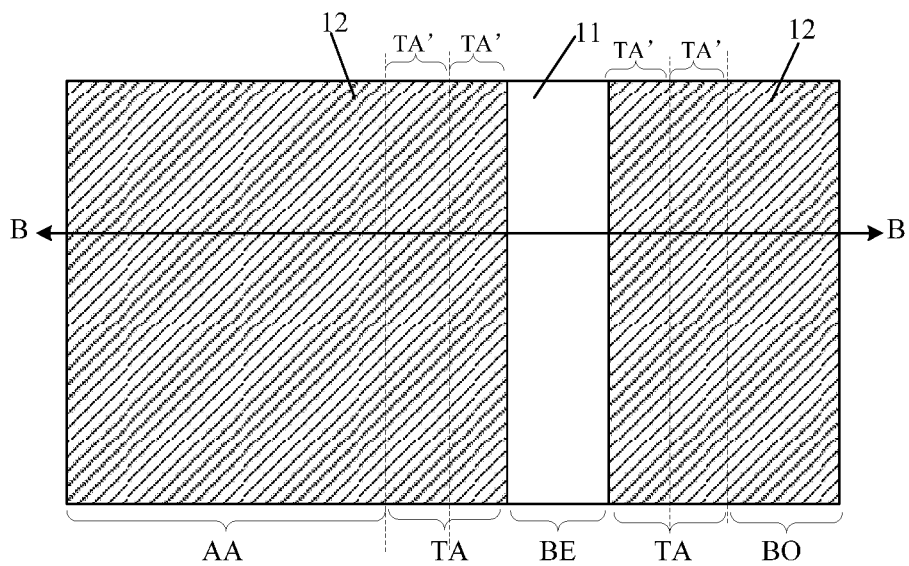
FIG. 3 is a plan view of a flexible substrate in an embodiment of the present disclosure.

As shown in FIG. 3, in one embodiment, the back film 12 can completely cover the transition regions TA.

In a specific embodiment of the present disclosure, the change in the amount of distribution per unit area of the back film 12 in each transition sub-region TA' can be achieved by the change in the coverage rate of the back film 12 in each transition sub-region TA'. Specifically, in any one of the transition regions TA, the coverage rate of the back film 12 in each of the transition sub-regions TA' gradually decreases in the direction gradually approaching the to-be-bent region BE. It should be noted that the coverage rate of the back film 12 in any one of the transition sub-regions TA' is the ratio of the coverage area of the back film 12 in a transition sub-region TA' to the area of the transition sub-region TA'.

Figure 11:
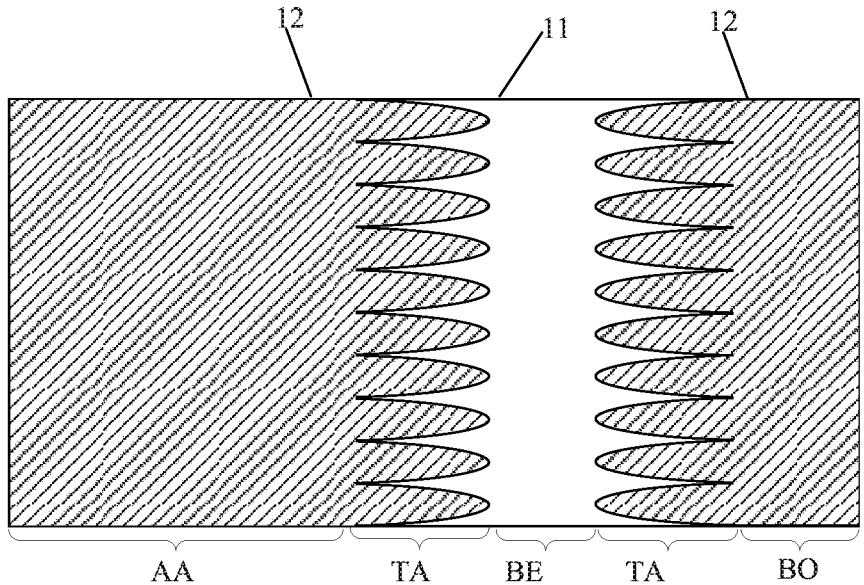
FIG. 11 is a plan view of a flexible substrate in an embodiment of the present disclosure.

In order to make the force distribution at each position in the same transition sub-region TA' uniform when the flexible base 11 bends, and more specifically, as shown in FIGS. 8 and 11, the portion of the back film 12 located in the transition regions TA includes a plurality of transition pattern portions 12a, the plurality of transition pattern portions 12a are arranged in a second direction perpendicular to the first direction. In FIGS. 8 and 11, the first direction is the left and right direction, and the second direction is the up and down direction. A size of the transition pattern portions 12a in the second direction gradually decreases from a side of the transition pattern portions 12a away from the to-be-bent region BE (left side in the figure) to a side of the transition pattern portions 12a close to the to-be-bent region BE (right side in the figure). The orthographic shape of each transition pattern portion 12a on the flexible base 11 may be a triangle (as shown in FIG. 8), or a part of an ellipse (as shown in FIG. 11), or may be other shape.

Figure 9:
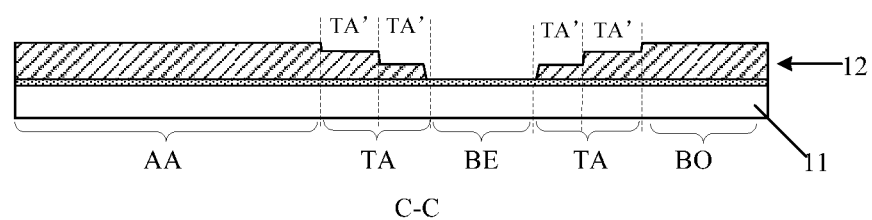
FIG. 9 is a first cross-sectional view taken along line CC of FIG. 8.
Figure 10:
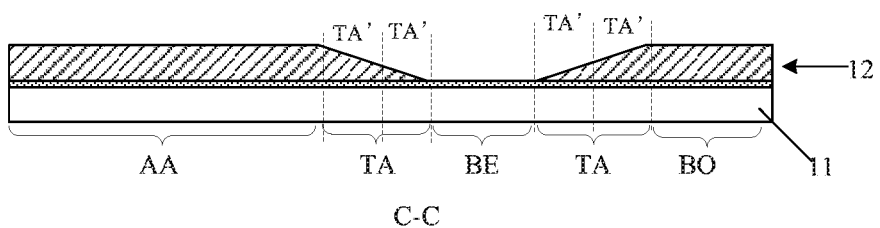
FIG. 10 is a second cross-sectional view taken along line CC of FIG. 8.

In a specific embodiment, the thickness of each position in the same one transition pattern portion 12a may be the same. In order to realize a narrow border, various embodiments may be combined such that when the flexible base 11 is bent, the closer a position of the flexible base 11 is to the to-be-bent region BE, the smaller the force is applied, thereby it is advantageous to reduce the bending radius. Specifically, as shown in FIGS. 8 and 9, with respect to any one of the transition pattern portions 12a, the thickness of the transition pattern portion 12a in the transition regions TA gradually decreases in the direction gradually approaching the to-be-bent region BE, and the transition pattern portion 12a has the same thickness in the same one transition sub-region TA'. Alternatively, as shown in FIGS. 8 and 10, with respect to any one of the transition pattern portions 12a, the thickness of the transition pattern portion 12a gradually decreases in the direction gradually approaching the to-be-bent region BE.

Considering that if the back film 12 also has a certain thickness in the to-be-bent region BE, the back film 12 of the to-be-bent region BE is squeezed to form a bulge when bent, so that a part of the signal line located at the to-be-bent region BE is broken or of other defects. To this end, in the present disclosure, the portion of the back film 12 located outside the transition regions TA is disposed in the display region AA and the binding region BO, and the back film is not provided in the to-be-bent region BE. In addition, the thickness of the back film 12 in the display region AA and the binding region BO is greater than or equal to the thickness of the back film 12 in the transition regions TA, respectively.

Further, an adhesive layer 13 is further disposed between the back film 12 and the flexible base 11, and the adhesive layer 13 covers the entire flexible base 11. The adhesive layer 13 is used to bond the back film 12 to the flexible base 11. In addition, the adhesive layer 13 can prevent the flexible base 11 from being damaged when the back film 12 in the to-be-bent region BE is removed.

Correspondingly, the present disclosure further provides a manufacturing method for flexible substrate. As shown in FIGS. 3 to 6, the flexible substrate is divided into a display region AA, a binding region on a side of the display region AA, a to-be-bent region BE between the display region AA and the binding region BO, and two transition regions TA between the to-be-bent region BE and the display region AA and between the to-be-bent region BE and the binding region BO, respectively. The transition regions TA include a plurality of transition sub-regions TA' arranged in a first direction, the first direction is a direction from the display region AA to the binding region BO. The manufacturing method includes:

providing a flexible base;

forming a back film on the flexible base; wherein a portion of the back film is located in the transition regions; in any one of the transition regions, the amount of distribution per unit area of the back film in each of the transition sub-regions gradually decreases in a direction gradually approaching the to-be-bent region.

Since the amount of the back film in the transition regions is not directly changed from a large amount to zero, but has a gradually decreasing transition process. Therefore, when the to-be-bent region is bent, the portion of the flexible base located in the transition regions smoothly transits into an arc shape, so that the back film is no longer changed significantly at the starting position of the bending. Therefore, the problem of stress concentration does not occur, and the phenomenon that breakage of the signal line at the starting position of the bending on the flexible base due to a large stress is decreased.

Figure 12:
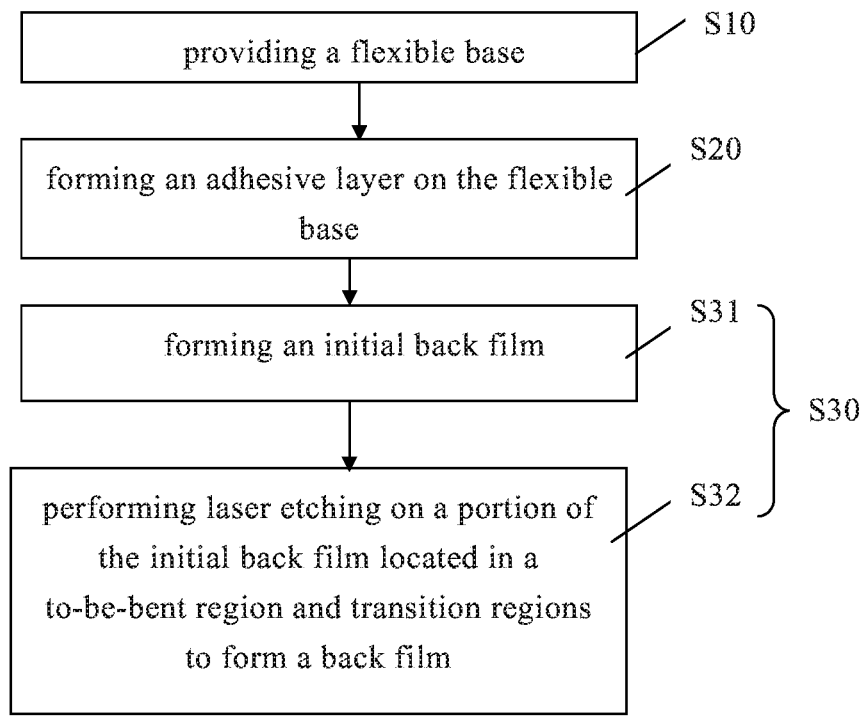
FIG. 12 is a flow chart of a manufacturing method for a flexible substrate provided by the present disclosure.

The manufacturing method for flexible substrate of the present disclosure will be described in detail below with reference to FIG. 12. The flexible substrate is divided into the above display region, binding region, to-be-bent region and transition region. The manufacturing method includes the following steps S10~S30:

S10: providing a flexible base.

S20: forming an adhesive layer on the flexible base.

S30: forming a back film on the flexible base; wherein the back film is on a side of the adhesive layer away from the flexible base. A portion of the back film is located in the transition regions; another portion of the back film is located in the display region and binding region. A thickness of the back film in both the display region and the binding region is greater than or equal to the thickness of the back film in the transition regions. In any one of the transition regions, the amount of distribution per unit area of the back film in each of the transition sub-regions gradually decreases in a direction gradually approaching the to-be-bent region.

The step S30 specifically includes:

S31: forming an initial back film. The initial back film may cover the entire flexible base, and the material of the initial back film may be polyethylene terephthalate (PET).

S32: performing laser etching on the initial back film to form the back film. Specifically, a portion of the initial back film located in the to-be-bent region and the transition region is laser etched to form the back film.

Wherein, the amount of distribution per unit area of the back film in each transition sub-region can be gradually changed by controlling the thickness of the back film. At this time, the step S32 may specifically include:

S32a: performing a first etching process on a portion of the initial back film located in the to-be-bent region and transition regions such that a thickness of the back film in any one of the transition regions gradually decreases in the direction gradually approaching the to-be-bent region. Alternatively, the thickness of the back film in any one of the transition sub-regions remains constant or gradually decreases in the direction gradually approaching the to-be-bent region.

Alternatively, the first etching process includes etching the initial back film at least once in each of the transition sub-regions, and the number of etchings performed in each of the transition sub-regions gradually increases from a side of the transition regions away from the to-be-bent region BE to a side of the transition regions close to the to-be-bent region. Wherein, the etching depth of each etching may be the same, so that the closer the transition sub-region to the to-be-bent region is, the more the thickness of the initial back film is etched away. By adopting this multiple etching method, it can prevent large depths of one-time etching and generating a large amount of heat. Therefore, the local heat of the initial back film is prevented from being too high; and in the back film formed by etching, the properties of the material at the respective positions are similar, which is more favorable for bending.

Figure 13A:
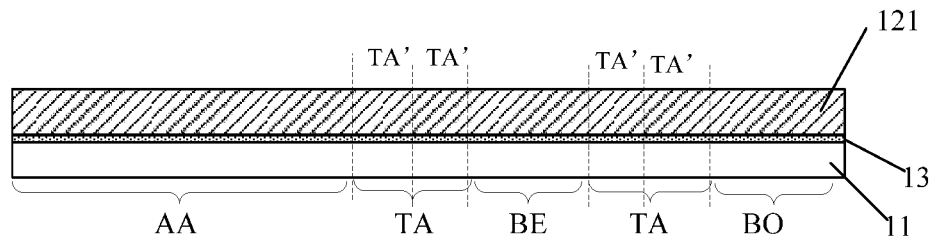
FIGS. 13a to 13d are flow charts of a first etching process in a manufacturing method for a flexible substrate.
Figure 13B:
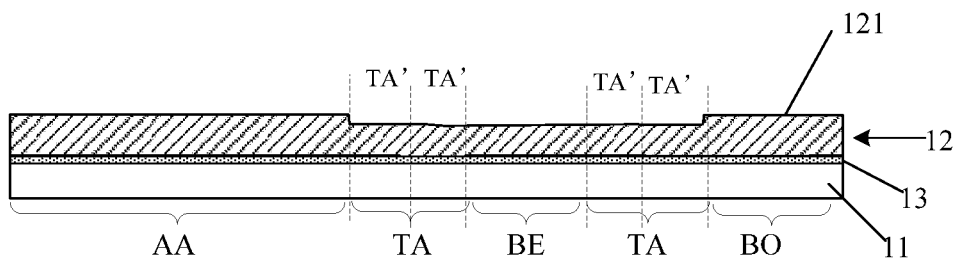
Figure 13C:
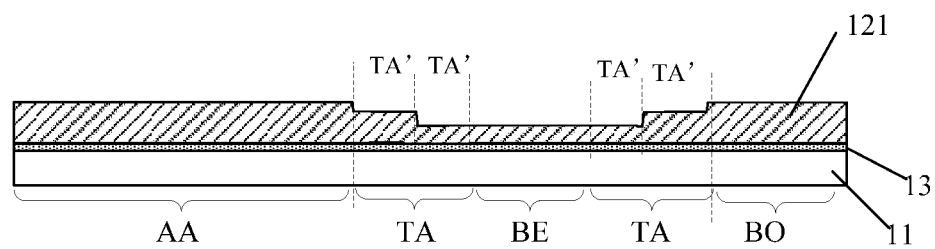
Figure 13D:
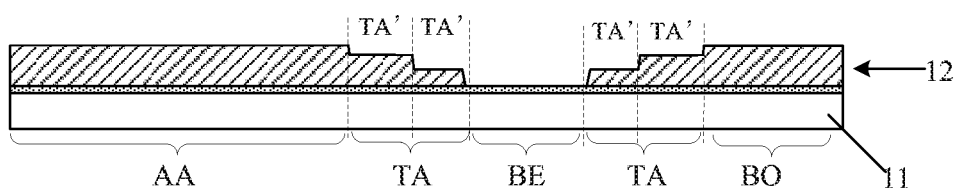

In actual production, the first etching in all transition sub-regions may be the same laser etching process, and the second etching on a portion of the transition sub-regions is the same laser etching process. Taking two transition sub-regions on both sides of the to-be-bent region as an example, FIGS. 13a to 13d are schematic flow diagrams of the first etching process. After the adhesive layer 13 and the initial back film 121 are formed on the flexible base 11 (as shown in FIG. 13a), the initial back film 121 of each transition sub-region TA' and the initial back film 121 of the to-be-bent region BE are etched by a first laser etching process; and the etching result is as shown in FIG. 13b. Thereafter, the initial back film 121 of the to-be-bent region BE and its adjacent two transition sub-regions TA' is etched by a second laser etching process, and the etching result is as shown in FIG. 13c. Finally, the initial back film 121 of the to-be-bent region BE is etched by a third laser etching process, and the etching result is as shown in FIG. 13d. Similarly, when a number (for example, three) of the transition sub-regions TA' are respectively disposed on each side of the to-be-bent region, after subtracting one transition sub-region TA' (from each side of the region toward the to-be-bent region BE) from the region formed by the previous etching, the remaining region is where the next etching is performed.

Definitely, the first etching process may also be such that the etching depth in each transition sub-region is gradually changed by controlling the laser energy or by controlling the etching time. Alternatively, the initial back film in the transition region (i.e., each transition sub-region) is completely etched by the first etching process.

The above step S32a is to gradually change the amount of distribution per unit area of the back film in each transition sub-region by controlling the thickness. In addition, it is also possible to gradually change the amount of distribution per unit area of the back film in each transition sub-region by controlling the coverage rate. At this time, step S32 may include:

S32b: performing a second etching process on a portion of the initial back film located in the transition regions, such that in any one of the transition regions, a coverage rate of the back film in each of the transition sub-regions gradually decreases in the direction gradually approaching the to-be-bent region. Specifically, the portion of the back film located in the transition regions includes a plurality of transition pattern portions, the plurality of transition pattern portions are arranged in a second direction perpendicular to the first direction. The size of the transition pattern portions in the second direction gradually decreases from a side of the transition pattern portions away from the to-be-bent region to a side of the transition pattern portions close to the to-be-bent region.

It should be noted that the foregoing step S32 may include only one of the steps S32a and S32b; or may include both. When the step S32 includes the steps S32a and S32b, the order of the steps S32a and S32b is not limited.

Correspondingly, the present disclosure further provides a display device including a display substrate, wherein the display substrate is obtained by bending the flexible substrate along a to-be-bent region of the flexible substrate. After bending, the binding region is located on the opposite side of the display region, and the to-be-bent region and at least a portion of each transition region together form a curved structure.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

What is claimed is:

1. A flexible substrate, wherein the flexible substrate is divided into a display region, a binding region on a side of the display region, a to-be-bent region between the display region and the binding region, two transition regions between the to-be-bent region and the display region and between the to-be-bent region and the binding region respectively;

the transition regions comprise a plurality of transition sub-regions arranged in a first direction, the first direction is a direction from the display region to the binding region;

the flexible substrate comprises a flexible base and a back film disposed on the flexible base, a portion of the back film is located in the transition regions;

in any one of the transition regions, the amount of distribution per unit area of the back film in each of the transition sub-regions gradually decreases in a direction gradually approaching the to-be-bent region;

wherein in any one of the transition regions, a coverage rate of the back film in each of the transition sub-regions gradually decreases in the direction gradually approaching the to-be-bent region, wherein the portion of the back film located in the transition regions comprises a plurality of transition pattern portions, the plurality of transition pattern portions are arranged in a second direction perpendicular to the first direction; and a size of the transition pattern portions in the second direction gradually decreases from a side of the transition pattern portions away from the to-be-bent region to a side of the transition pattern portions close to the to-be-bent region.

2. The flexible substrate according to claim 1, wherein a thickness of the back film in any one of the transition regions gradually decreases in the direction gradually approaching the to-be-bent region.

3. The flexible substrate according to claim 2, wherein a thickness of the back film in any one of the transition sub-regions remains constant or gradually decreases in the direction gradually approaching the to-be-bent region.

4. The flexible substrate according to claim 1, wherein a portion of the back film located outside the transition regions is disposed in the display region and the binding region, a thickness of the back film in both the display region and the binding region is greater than or equal to the thickness of the back film in the transition regions.

5. The flexible substrate according to claim 4, wherein an adhesive layer is further disposed between the back film and the flexible base, the adhesive layer covers the entire flexible base.

6. A display device comprising a display substrate obtained by bending a flexible substrate according to claim 1 along a to-be-bent region of the flexible substrate.

7. A manufacturing method for flexible substrate, the flexible substrate being divided into a display region, a binding region on a side of the display region, a to-be-bent region between the display region and the binding region, two transition regions between the to-be-bent region and the display region and between the to-be-bent region and the binding region respectively; the transition regions comprising a plurality of transition sub-regions arranged in a first direction, the first direction being a direction from the display region to the binding region; the manufacturing method comprising:

providing a flexible base;

forming a back film on the flexible base; wherein a portion of the back film is located in the transition regions; in any one of the transition regions, the amount of distribution per unit area of the back film in each of the transition sub-regions gradually decreases in a direction gradually approaching the to-be-bent region, wherein the portion of the back film located in the transition regions comprises a plurality of transition pattern portions, the plurality of transition pattern portions are arranged in a second direction perpendicular to the first direction; and a size of the transition pattern portions in the second direction gradually decreases from a side of the transition pattern portions away from the to-be-bent region to a side of the transition pattern portions close to the to-be-bent region.

8. The manufacturing method according to claim 7, wherein the step of forming a back film on the flexible base comprises:

forming an initial back film;

performing laser etching on the initial back film to form the back film.

9. The manufacturing method according to claim 8, wherein the step of performing laser etching on the initial back film comprises:

performing a first etching process on a portion of the initial back film located in the transition regions such that a thickness of the back film in any one of the transition regions gradually decreases in the direction gradually approaching the to-be-bent region.

10. The manufacturing method according to claim 9, wherein the thickness of the back film in any one of the transition sub-regions remains constant or gradually decreases in the direction gradually approaching the to-be-bent region.

11. The manufacturing method according to claim 9, wherein the first etching process comprises etching the initial back film at least once in each of the transition sub-regions, and the number of etchings performed in each of the transition sub-regions gradually increases in the direction gradually approaching the to-be-bent region.

12. The manufacturing method according to claim 11, wherein the step of performing laser etching on the initial back film comprises:

performing a second etching process on a portion of the initial back film located in the transition regions, such that in any one of the transition regions, a coverage rate of the back film in each of the transition sub-regions gradually decreases in the direction gradually approaching the to-be-bent region.

13. The manufacturing method according to claim 11, wherein the step of forming the back film on the flexible base further comprises:

forming an adhesive layer on the flexible base, the back film is located on a side of the adhesive layer away from the flexible base.

14. The manufacturing method according to claim 7, wherein a portion of the back film located outside the transition regions is disposed in the display region and the binding region, a thickness of the back film in both the display region and the binding region is greater than or equal to the thickness of the back film in the transition regions.

\* \* \* \* \*